US009772981B2

(12) United States Patent
Osmond et al.

(10) Patent No.: US 9,772,981 B2
(45) Date of Patent: Sep. 26, 2017

(54) COMBINED CONTENT INDEXING AND DATA REDUCTION

(75) Inventors: Roger F. Osmond, Littleton, MA (US); Gil Goren, Ashland, MA (US)

(73) Assignee: EMC IP HOLDING COMPANY LLC, Hopkinton, MA (US)

(*) Notice: Subject to any disclaimer, the term of this patent is extended or adjusted under 35 U.S.C. 154(b) by 2091 days.

(21) Appl. No.: 11/277,790

(22) Filed: Mar. 29, 2006

(65) Prior Publication Data
US 2007/0233707 A1   Oct. 4, 2007

(51) Int. Cl.
*G06F 7/00*       (2006.01)
*G06F 17/00*      (2006.01)
*G06F 15/16*      (2006.01)
*G06F 17/22*      (2006.01)
*G06F 17/30*      (2006.01)
*H03M 7/30*       (2006.01)

(52) U.S. Cl.
CPC .... *G06F 17/2264* (2013.01); *G06F 17/30321* (2013.01); *G06F 17/30619* (2013.01); *H03M 7/30* (2013.01)

(58) Field of Classification Search
CPC ........... G06F 17/30663; G06F 17/2755; G06F 17/277; G06F 17/30616; G06F 17/30684; G06F 17/30312; H03M 13/09; H03M 7/30; G06T 9/005
USPC .............. 704/1, 4, 9–10; 707/696, 791, 793, 707/796–797, 956–957, 959
See application file for complete search history.

(56) References Cited

U.S. PATENT DOCUMENTS

| | | | | |
|---|---|---|---|---|
| 5,254,990 A * | 10/1993 | Yoshida et al. | | 341/51 |
| 5,951,623 A * | 9/1999 | Reynar et al. | | 708/203 |
| 6,336,117 B1 * | 1/2002 | Massarani | | 707/100 |
| 6,374,210 B1 * | 4/2002 | Chu | | 704/9 |
| 6,480,887 B1 * | 11/2002 | Hayama | | 709/217 |
| 6,611,213 B1 * | 8/2003 | Bentley et al. | | 341/51 |
| 6,792,418 B1 * | 9/2004 | Binnig | | G06F 17/30684 704/1 |
| 7,020,654 B1 * | 3/2006 | Najmi | | 707/100 |
| 7,092,870 B1 * | 8/2006 | Chen et al. | | 704/9 |
| 7,177,795 B1 * | 2/2007 | Chen et al. | | 704/9 |
| 7,266,553 B1 * | 9/2007 | Anderson et al. | | 707/5 |

(Continued)

OTHER PUBLICATIONS

Storer et al. "Data Compression via Textual Substitution" Journal of the Association for Computing Machinary vol. 29, No. 4, Oct. 1983 pp. 928-951.*

(Continued)

*Primary Examiner* — Jason Liao
*Assistant Examiner* — Berhanu Mitiku
(74) *Attorney, Agent, or Firm* — Anderson Gorecki LLP; Holmes Anderson

(57) ABSTRACT

Data storage is improved by combining content indexing and data reduction in text-containing files by using common word elimination. Raw data is processed by finding words in selected files, creating an index of found words, and replacing the words in the raw data with pointers to the corresponding words in the index. Each word appears only once in the index. Consequently, the index is relatively small and the procedure is completely reversible. In particular, the index is small relative to other methods because the data is transformed in place, and the transformed data and index are used together to capture the total information about the data.

30 Claims, 4 Drawing Sheets

(56) References Cited

U.S. PATENT DOCUMENTS

| | | | |
|---|---|---|---|
| 2004/0098250 A1* | 5/2004 | Kimchi et al. .................... 704/9 |
| 2004/0236801 A1* | 11/2004 | Borden ............. G06F 17/30575 |
| 2005/0080614 A1* | 4/2005 | Bennett ............................ 704/9 |
| 2006/0106832 A1* | 5/2006 | Ben-Dyke ......... G06F 17/30327 |
| 2006/0235843 A1* | 10/2006 | Musgrove et al. ............... 707/6 |
| 2007/0073533 A1* | 3/2007 | Thione et al. .................... 704/9 |
| 2007/0203916 A1* | 8/2007 | Kwak ............... G06F 17/30126 |
| 2007/0219781 A1* | 9/2007 | Roche et al. ..................... 704/9 |

OTHER PUBLICATIONS

Welch "A Technique for High-Performance Data Compression" Sperry Research Center Jun. 1984, MCC, 9430 Research Blvd., Austin, TX 78759.*

Noam_Chomsky "Syntactic Structures" Massachusetts Institute of Technology Mouton Publishers The Hague Paris 1957.*

\* cited by examiner

COMBINED CONTENT INDEXING AND DATA REDUCTION

FIELD OF THE INVENTION

This invention is generally related to data storage, and more particularly to indexing and compressing files that contain text.

BACKGROUND OF THE INVENTION

Data reduction has been generally recognized as desirable for some time. Since data storage is relatively costly, there has always been at least some interest in reducing storage requirements. However, the need to reduce storage requirements may soon become even more important because data set growth is currently exceeding growth in the capabilities of storage technology. At least one estimate is that data growth is currently about 60% per year. If this trend continues, there will eventually be more data than available storage.

Various techniques are known for compressing data. For example, LZW and other compression algorithms can compress typical data by a factor of two. Common file elimination ("CFE") and block-level de-duplication in combination could yield an order of magnitude in reduction of storage requirements. However, even if compression techniques were able to keep pace with data growth, data compression has some drawbacks and consumers often want more from storage than data compression.

One drawback of data compression is that data retrieval tends to be slowed by compression. In particular, it generally takes more time to decompress and retrieve data than to simply retrieve uncompressed data. One of the consumer demands conflicting with compression is indexing. Indexing is a process of data inspection which facilitates search and retrieval by pre-processing data to determine where particular information is stored. Indexing generally occurs in three tiers: file meta-data only, e.g., size, file type, age, name, owner, permission; file-type-specific meta-data, e.g., Word, Excel, CAD; and content, e.g., text. Consumers desire indexing because it tends to increase productivity. However, indexing also increases storage requirements. In some cases an index may be greater in size than the data which it describes. Compression renders data effectively unreadable, and therefore not indexible. This forces consumers to choose between the productivity gains from indexing and the equipment reduction from compression. Alternately, they must perform these operations separately, decompressing data to render it indexible, thus increasing computational and storage resource consumption.

SUMMARY OF THE INVENTION

In accordance with one embodiment of the present invention, a computer program product stored on computer-readable media which, when executed, is operable to index content and reduce data, comprises: logic operable to find individual semantic units in at least one file in data storage; logic operable to determine whether a found semantic unit is in an index, and if the found semantic unit is not in the index then to add that semantic unit to the index; and logic operable to replace found semantic units with pointers to corresponding semantic units in the index.

In accordance with another embodiment of the invention, a method for indexing content and reducing data, comprises the steps of: finding individual semantic units in at least one file in data storage; in response to finding a semantic unit, determining whether the semantic unit is in an index, and if the found semantic unit is not in the index then adding that semantic unit to the index; and replacing found semantic units with pointers to corresponding semantic units in the index.

In accordance with another embodiment of the invention, apparatus for processing and storing data, including indexing content and reducing the data, comprises: storage media operable to store data and an index; and a processor operable to: find individual semantic units in at least one file in the storage media; determine whether a found semantic unit is in the index, and if the found semantic unit is not in the index then to add that semantic unit to the index; and replace found semantic units with pointers to the corresponding semantic units in the index.

The invention offers various advantages depending on the implemented embodiment. One advantage is reduced overall (index plus data) storage requirements. In particular, although the technique may not reduce the data files as much as some compression techniques, improved overall reduction is realized because the resulting index is relatively small and functions both as an index and a compression dictionary. Another advantage is that combining indexing and data reduction permits single-pass processing which can be more efficient than traditional, separate indexing and data reduction operations.

DETAILED DESCRIPTION

Figure 1:
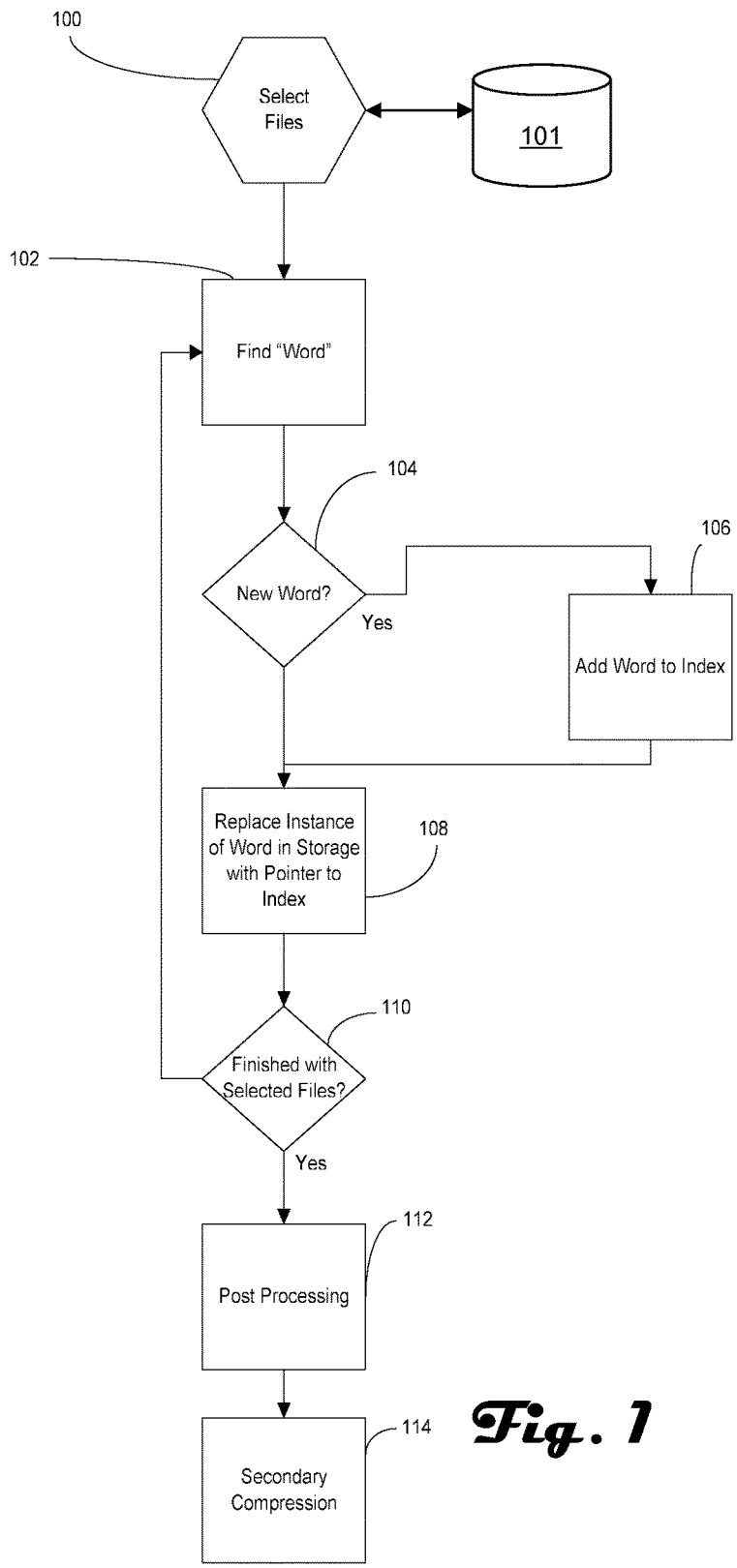
FIG. 1 is a flow diagram of combined indexing and data reduction.
Figure 2:
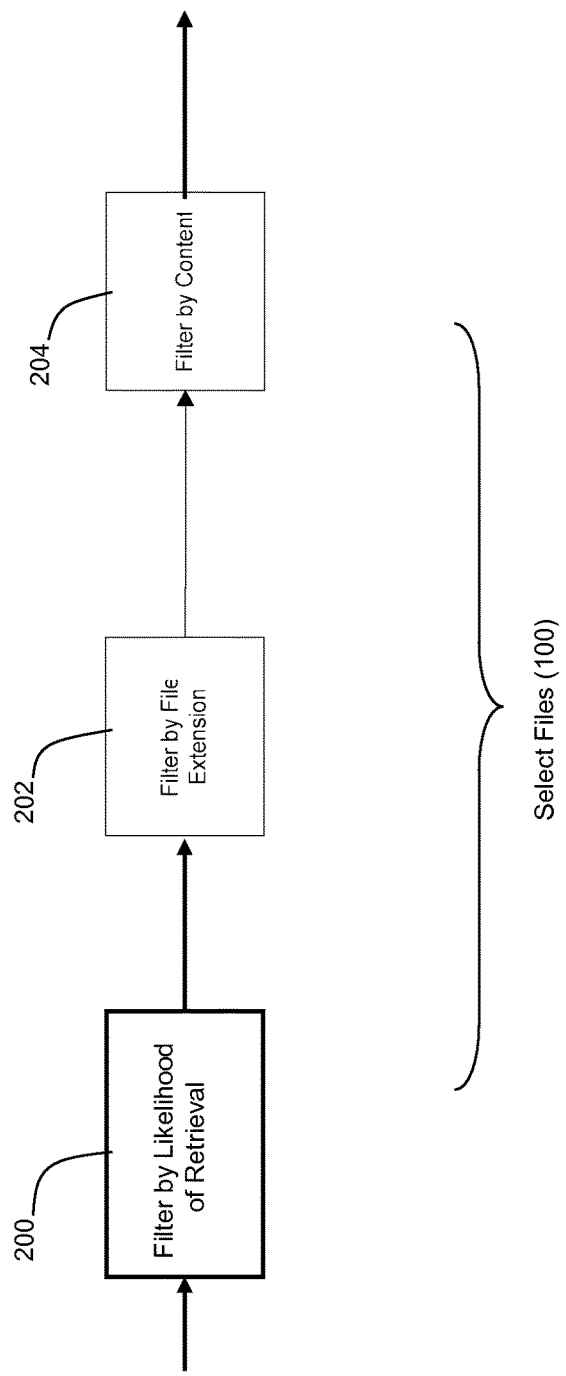
FIG. 2 illustrates the file selection of FIG. 1 in greater detail.
Figure 4:
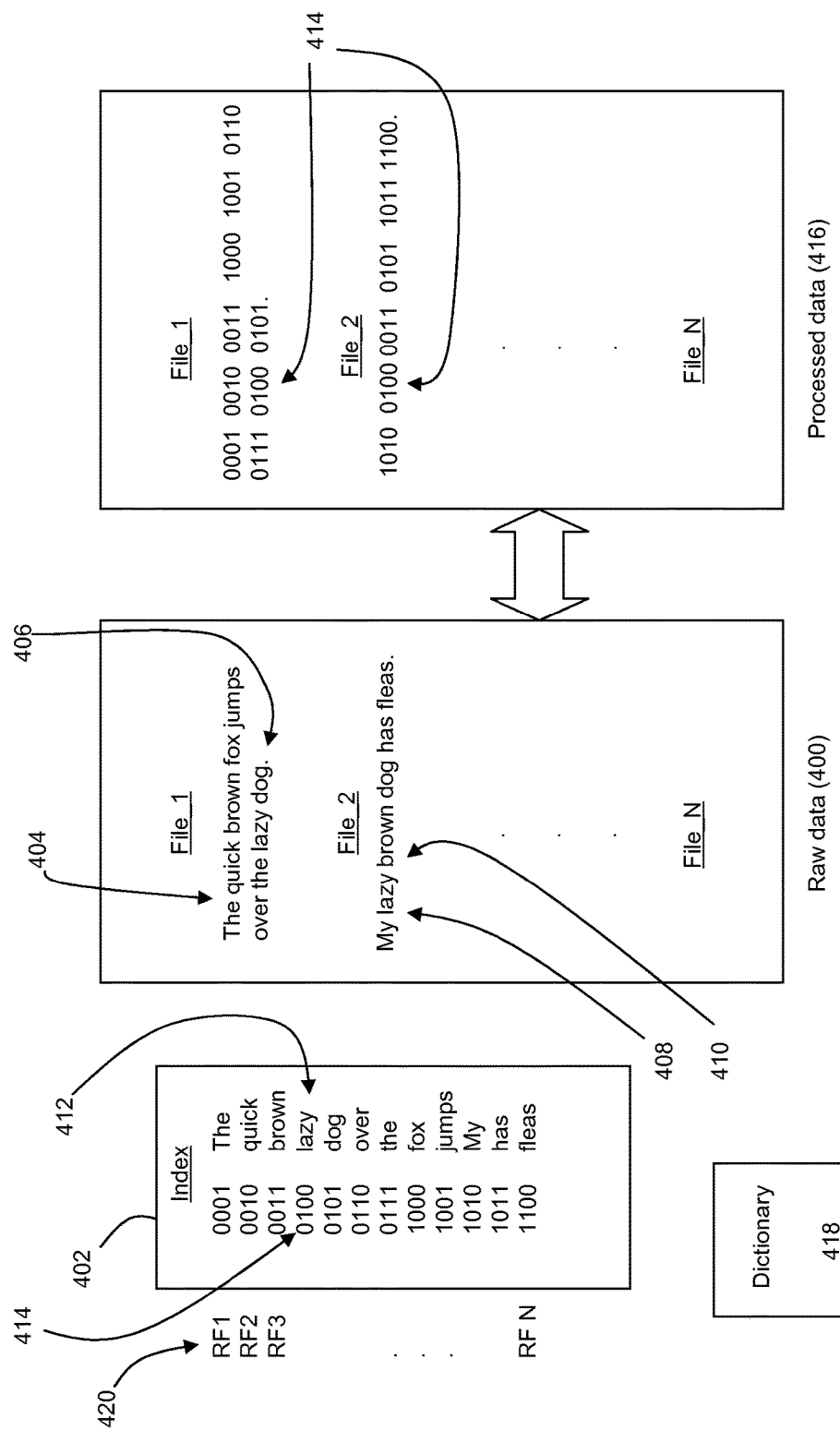
FIG. 4 illustrates portions of an index and data files resulting from the technique of FIG. 1.

Referring to FIGS. 1, 2 and 4, the present invention combines content indexing and data reduction to provide reduction in overall storage requirements, i.e., data (400) and index (402). In an initial step (100), files are selected from storage (101) for processing. Files can be optionally selected by first filtering based on likelihood of retrieval, as indicated in step (200). This filter step classifies files as belonging in one of: primary storage, secondary storage and intermediate storage. Primary storage is a class of files which are likely to be retrieved soon or otherwise need to be quickly accessible. Primary storage files may be left uncompressed, but regardless of treatment are not selected for processing by filtering step (200). Secondary storage is a class of files which are unlikely to be retrieved soon or subject to search. Secondary storage files may be compressed with the most efficient available compression technique and deep archived. Secondary storage file are not selected for processing by filtering step (200). Having filtered out the files for primary and secondary storage, what remains are files suitable for intermediate storage. The intermediate storage files are then filtered by file extension to remove particularly poor candidates, as indicated by step (202). In particular, file extensions which indicate file types having little or no text, e.g., exe, .jPG, .GIF, are removed from consideration. The remaining files are then filtered by content, as indicated in step (204). In particular, the files are examined for text content. Files having less than a predetermined amount or percentage of text may be removed from consideration. The remaining files are subject to further processing.

Figure 3:
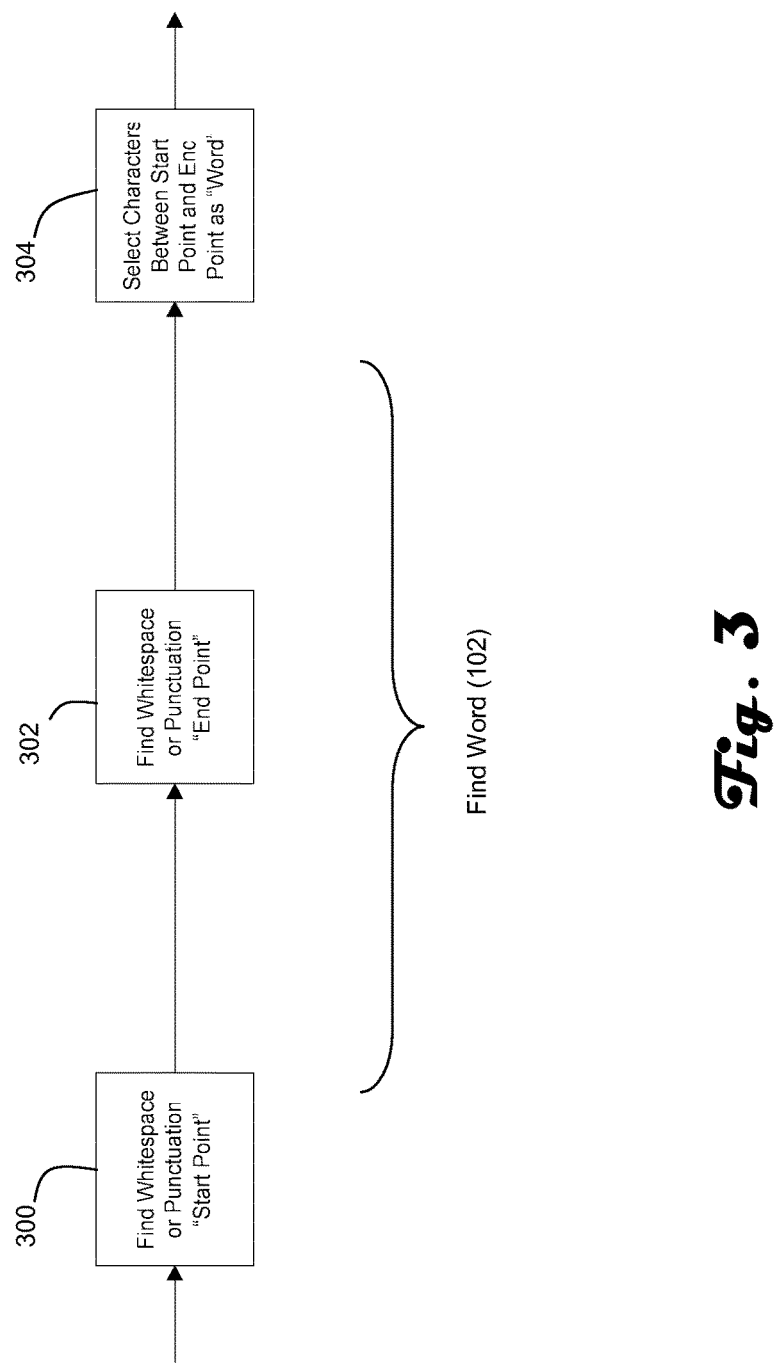
FIG. 3 illustrates the word find operation of FIG. 1 in greater detail.

Referring now to FIGS. 1, 3 and 4, the selected files (File 1 through File N) are processed as a group. The first step (102) in processing the selected files is to find a semantic unit. In the illustrated embodiment the semantic unit is a word, i.e., a legitimate, non-control character or characters separated from other characters by white space or punctuation. However, the semantic unit might alternatively be a syllable, phrase, or other grouping of words, characters or letters, or any combination thereof. In order to accomplish this step (102), the raw data (400) is sequentially parsed until whitespace (404) or punctuation (406) is located. The located whitespace or punctuation is the "start point," as indicated in step (300). Parsing then continues until the next sequential whitespace or punctuation is located, as indicated in step (302). This is the "end point." The characters between the start point and the end point are selected as the word, as indicated by step (304). For example, in File 2 the whitespace (408) is a start point and whitespace (410) the endpoint bracketing the word "lazy." Once the word is identified, a determination is made as to whether it is a new word, as indicated in step (104). In particular, the index (402) is examined to determine if the word exists in the index. If the word is a new word, i.e., it does not exist in the index, then an entry is added to the index (402) as indicated in step (106). In particular, the word itself, e.g., "lazy" (412) is added to the index. Then, whether the word was new or not, the instance of the word between the start point and end point in the file is replaced with a pointer, e.g., pointer (414), to the instance of the word in the index as shown in step (108). Processing continues in this manner until the file, and the other selected files, have been processed as indicated by step (110), resulting in processed data (416). In other words, the raw data (400) is replaced in storage with processed data (416)

Once the selected files have been processed, resulting in processed data (416) and index (402), it is possible to conduct post processing as indicated in step (112). Post processing can enhance the functionality of the index (402) by describing the data in terms other than the individual words which occur in the text. For example, classifications based on meta-data such as file size, file type, age, and name may be made. Various post-processing schemes are known in the art.

The processed data (416) may also be secondarily compressed based on subordinate semantic units, e.g., syllables of words, as indicated in step (114). For example, a dictionary (418) of syllables can be referenced to classify the words in the index in terms of individual syllables. Duplicate instances of syllables in the processed data (416) are then replaced with pointers to the dictionary (418) or a separate syllable index. It should be noted that subordinate semantic unit-based compression and indexing, including syllable compression and indexing, need not necessarily be a post-process. For example, such compression and indexing could be part of the first pass processing.

Those skilled in the art will recognize that variations and alternative to the algorithm illustrated in FIG. 3 could be used for finding words. The invention should not therefore be viewed as limited to this particular embodiment.

Referring to FIG. 4, other enhancements may be employed to enhance the efficiency of the technique. For example, the index (402) can be made either case sensitive or case insensitive. In one embodiment the case of the word, i.e., lower case and capitalized, is encoded into a single bit which is appended to the pointer. This trade-off adds a bit to each pointer but reduces the number of entries in the index.

In another embodiment the pointers are of variable size and the index (402) is organized by ranking factor (420). The ranking factor indicates, for each word in the index, the relative savings in terms of data reduction achieved by processing the word in the manner described above. For example, long (in terms of number of characters) and frequently occurring words would have a higher ranking factor than shorter, less frequently occurring words. Words with higher ranking factor would then be associated with shorter pointers in order to enhance efficiency. A simple example would be to omit the leading 0s in the illustrated pointers.

It will be appreciated by those skilled in the art that the raw data, and portions of the raw data, can be fully reconstructed. For example, a file in processed data (416) can be retrieved by employing the pointers to obtain the corresponding words from the index. If whitespace and punctuation are left in the processed data then the process of obtaining raw data from the processed data is simple.

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative structures, one skilled in the art will recognize that the system may be embodied using a variety of specific structures. Accordingly, the invention should not be viewed as limited except by the scope and spirit of the appended claims.

What is claimed is:

1. A computer program product stored on a non-transitory computer-readable media comprising:
   logic which concurrently indexes content and reduces data in data storage, including:
      logic which finds individual semantic units in at least one file in data storage, each semantic unit including at least one word;
      logic which determines whether a found semantic unit is in an index, and if the found semantic unit is not in the index then adds that semantic unit to the index; and
      logic which replaces found semantic units with index pointers to corresponding semantic units in the index.

2. The program product of claim 1 wherein the semantic units are words of a human language.

3. The program product of claim 2 wherein each instance of a found word occurs in the index only once.

4. The program product of claim 2 further comprising logic that selects files for processing by filtering files based on likelihood of retrieval.

5. The program product of claim 2 further comprising logic that selects files for processing by filtering files based on file extension.

6. The program product of claim 2 further comprising logic that selects files for processing by filtering files based on content.

7. The program product of claim 2 further comprising logic that selects, as a word, characters bracketed by one or more of whitespace and punctuation.

8. The program product of claim 2 further comprising logic that ranks words in the index in terms of data reduction and assign pointers to words based on pointer length and word ranking.

9. The program product of claim 2 further comprising logic that post-processes the data to provide indexing by terms other than words.

10. The program product of claim 2 further comprising logic that further compresses the processed data by syllable.

11. A method for indexing content and reducing data, comprising the steps of:
concurrently indexing content and reducing data in data storage by:
finding individual semantic units in at least one file in data storage, each semantic unit including at least one word;
in response to finding a semantic unit, determining whether the semantic unit is in an index, and if the found semantic unit is not in the index then adding that semantic unit to the index; and
replacing found semantic units with index pointers to corresponding semantic units in the index.

12. The method of claim 11 wherein the semantic unit is a word of a human language.

13. The method of claim 12 wherein each instance of a found word occurs in the index only once.

14. The method of claim 12 further comprising the step of selecting files for processing by filtering files based on likelihood of retrieval.

15. The method of claim 12 further comprising the step of selecting files for processing by filtering files based on file extension.

16. The method of claim 12 further comprising the step of selecting files for processing by filtering files based on content.

17. The method of claim 12 further comprising the step of selecting, as a word, characters bracketed by one or more of whitespace and punctuation.

18. The method of claim 12 further comprising the steps of ranking words in the index in terms of data reduction and assigning relatively shorter pointers to words having better potential data reduction ranking.

19. The method of claim 12 further comprising the steps of post-processing the data to provide indexing by terms other than words.

20. The method of claim 12 further comprising the step of compressing the processed data by syllable.

21. Apparatus for processing and storing data, including indexing content and reducing the data, comprising:
storage media that concurrently stores data and an index; and
a processor that:
finds individual semantic units in at least one file in the storage media, each semantic unit including at least one word;
determines whether a found semantic unit is in the index, and if the found semantic unit is not in the index then adds that semantic unit to the index; and
replaces found semantic units with index pointers to the corresponding semantic units in the index.

22. The apparatus of claim 21 wherein the semantic unit is a word in a human language.

23. The apparatus of claim 22 wherein each instance of a found word occurs in the index only once.

24. The apparatus of claim 22 wherein the processor selects files for processing by filtering files based on likelihood of retrieval.

25. The apparatus of claim 22 wherein the processor selects files for processing by filtering files based on file extension.

26. The apparatus of claim 22 wherein the processor selects files for processing by filtering files based on content.

27. The apparatus of claim 22 wherein the processor selects, as a word, characters bracketed by one or more of whitespace and punctuation.

28. The apparatus of claim 22 wherein the processor ranks words in the index in terms of data reduction and assigns relatively shorter pointers to words having better potential data reduction ranking.

29. The apparatus of claim 22 wherein the processor post-processes the data to provide indexing by terms other than words.

30. The apparatus of claim 22 wherein the processor further compresses the processed data by syllable.

\* \* \* \* \*